United States Patent [19]

Takahashi

[11] 4,309,625
[45] Jan. 5, 1982

[54] FLIP-FLOP CIRCUIT

[75] Inventor: Toru Takahashi, Tokyo, Japan

[73] Assignee: Nippon Electric Co., Ltd., Tokyo, Japan

[21] Appl. No.: 89,743

[22] Filed: Oct. 31, 1979

[30] Foreign Application Priority Data

Oct. 31, 1978 [JP] Japan .............................. 53/134296

[51] Int. Cl.³ ...................... H03K 3/286; H03K 3/289
[52] U.S. Cl. ............................. 307/272 A; 307/225 R; 307/291; 328/41
[58] Field of Search .................. 307/272 A, 289, 291, 307/220 R, 220 C, 225 R, 225 C; 328/39, 41, 46, 48, 51

[56] References Cited

U.S. PATENT DOCUMENTS 3,644,758  2/1972  Matsue ............................ 307/291
3,728,561  4/1973  Brocker, Jr. .................... 307/272 A

*Primary Examiner*—John Zazworsky
*Attorney, Agent, or Firm*—Laff, Whitesel, Conte & Saret

[57] ABSTRACT

A flip-flop circuit provided with gate function is disclosed. The flip-flop circuit comprises first and second transistors whose bases and collectors are cross-coupled at first and second nodes, third and fourth transistors of which the collectors are respectively coupled to the first and second nodes, first switching means coupled in parallel with the collector and the emitter of the first transistor, and a second switching means coupled in parallel with the collector and the emitter of the fourth transistor, wherein the first and the second switching means are controlled by the same signal.

7 Claims, 6 Drawing Figures

FLIP-FLOP CIRCUIT

The present invention relates to flip-flop circuits and, more particularly, to flip-flop circuits constructed by use of a current switching type logic.

At present, a current switching type latch circuit is predominantly used as a basic circuit of a high speed flip-flop circuit. In view of requirement of a high speed operation, flip-flops of various types such as RS, JK and D types, are generally realized by applying various feedbacks to the current switching type circuits, as basic circuits. In designing various logic circuits including sequential logic circuits, there is a case where a flip-flop circuit in a certain portion of the logic circuit is not used as a flip-flop and the clock input is directly applied to the logic circuit, at the following stage to which the output of the flip-flop is applied. Particularly in the frequency divider, such a method is often used for varying the frequency dividing ratio. In this case, the output of the flip-flop circuit and the clock input to the flip-flop are switched by means of a gate circuit controlled by another control input signal, for supplying it to the succeeding stage logic circuit.

Thus, the above-mentioned method needs an additional current flow into the gate circuit for such a purpose, so that power consumption is increased and a delay time is elongated, due to a delay time of the gate circuit.

Accordingly, an object of the present invention is to provide a flip-flop circuit in which an optional one of a latched output and a clock input is readily obtained at its output, with no increase of power consumption and delay time.

According to the present invention, there is a flip-flop circuit comprising first and a second transistors whose bases and collectors are cross-coupled at first and a second nodes. Third and a fourth transistors have collectors which are coupled to the first and second nodes to form a current switching circuit. First switching means are connected in parallel with the collector and the emitter of the first transistor. Second switching means are connected to the collector and emitter of the fourth transistor, wherein the first and the second switching means are controlled by the same control signal.

According to another aspect of the present invention, a semiconductor logic circuit includes a flip-flop. A first current switching circuit with a pair of output points is commonly used with the flip-flop. A second current switching circuit complementally switches the flip-flop and the first current switching circuit. A first transistor has a collector coupled to one of the output points and an emitter coupled to commonly coupled emitters of the flip-flop. A second transistor has a collector coupled to the other of the output points and an emitter coupled to commonly coupled emitters of the first current switching circuit. A control signal is supplied to bases of the first and second transistors.

According to the present invention, a circuit comprises a first node, a second node, a third node, a fourth node, a first and a second transistor having first parts and control parts cross-coupled at the first and the second nodes and second parts commonly coupled to the third node. A third transistor has a first part coupled to the first node and a second part coupled to the fourth node. A fourth transistor has a first part coupled to the second node and a second part coupled to the fourth node. At least one of the third and fourth transistors receives a first signal at its control part. Responsive to a second signal the third node and the fourth node are selectively coupled to the constant current source means. First switching means are coupled between the second node and the third node and second switching means are coupled between the first node and the fourth node. The first and second switching means are simultaneously controlled by a control signal.

In the above circuit, the first to fourth transistors may be bipolar transistors having collectors as their first parts, bases as their control parts and emitters as their second parts.

Furthermore in the above circuit, the first to fourth transistors may be insulated-gate field-effect transistors having drains as their first parts, gates as their control parts and sources as their second parts.

According to the invention, a circuit comprises a plurality of stages of master-slave flip-flops including a master flip-flop and a slave-flip-flop, the master flip-flop including a first and a second node. First and second transistors have collectors and bases cross-coupled at the first and second nodes. A third transistor has a collector coupled to the first node. A fourth transistor is coupled to the second node. A first means is responsive to a first control signal for selectively enabling one pair of the first and second transistors and third and fourth transistors. The slave flip-flop includes a third and a fourth nodes. Fifth and sixth transistors have collectors and bases cross-coupled at the third and fourth nodes. Seventh and eighth transistors have collectors respectively coupled to the third and fourth nodes. Second means are responsive to a second control signal having a complementary relation to the first control signal for selectively enabling one pair of the fifth and sixth transistors and the seventh and eighth transistor. The second node is coupled to a base of the seventh transistor. The circuit further includes in at least one of the slave flip-flop first switching means for selectively coupling the fourth node and an emitter of the sixth transistor. Second switching means are selectively coupled to the third node and to an emitter of the seventh transistor. The first and second switch means are simultaneously switched to conductivity.

The invention will be better understood upon the following description in connection with the accompanying drawings, in which.

Figure 1:
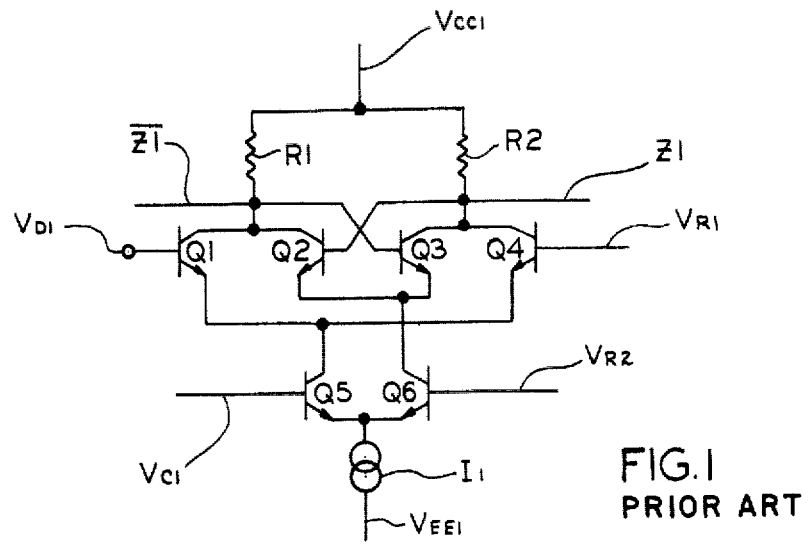
FIG. 1 shows a circuit diagram of a conventional flip-flop circuit.

Referring first to FIG. 1, there is shown a conventional flip-flop circuit which is known to those skilled in this field. In operation, a data input applied to an input terminal $V_{D1}$ is sampled by turning on a transistor $Q_5$ when a clock input $V_{C1}$ is in a high level. When it is in a low level, its state is held by turning on a transistor $Q_6$. Through the operation, an output $Z_1$ has a logical output with the same phase as the phase of the input signal applied to the input $V_{D2}$ and an output $Z_1$ has a logical output which is in opposite phase as compared with the phase of the input. While reference voltages necessary for logic operation are applied to terminals $V_{R1}$ and $V_{R2}$ in general. In some cases, complementary signals, with respect to the input signal and the clock signal, may be applied thereto in place of $V_{R1}$ and $V_{R2}$ whereby the flip-flop circuit is operated in a balanced type.

This type flip-flop circuit functions merely as a sequential circuit and it is not possible to obtain an output in the form of data-through whenever the input signal or the clock signal is required.

Figure 2:
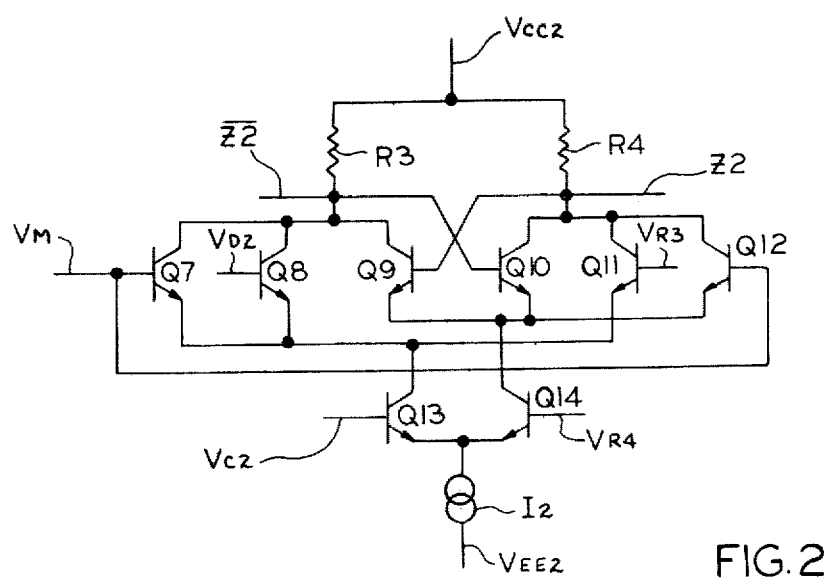
FIG. 2 shows a circuit diagram of a first embodiment of a flip-flop according to the invention.

An embodiment of a flip-flop circuit according to the invention will be described with reference to FIG. 2. In the circuit, transistors $Q_7$ and $Q_{12}$ coupled respectively in parallel with transistors $Q_8$ and $Q_{11}$, are newly added components and the bases of the transistors $Q_7$ and $Q_{12}$ are commonly connected to a terminal $V_M$ for switching.

For simplicity of explanation, it is assumed that the bases of the transistors $Q_{11}$ and $Q_{14}$ are supplied with intermediate potentials of the input side logic levels as reference potentials $V_{R3}$ and $V_{R4}$, respectively. When a potential level at the terminal $V_M$ is logically low, the transistors $Q_7$ and $Q_{12}$ are cut-off irrespective of the logical states of a data input $V_{D2}$ and a clock input $V_{C2}$. The circuit operates as an ordinary current switching type latch circuit, similar to the operation of the circuit shown in FIG. 1. To be more specific, when the clock input $V_{C2}$ is in a high level, the data input $V_{D2}$ is written thereinto and the data thus written is held when the clock input $V_{C2}$ is in a low level.

Let us consider a case where the level at the terminal $V_M$ is high. When the clock $V_{C2}$ is high, the transistor $Q_7$ is ON, so that current flows through a resistor $R_3$ while no current flows into a resistor $R_4$, and the output $Z_2$ is high the clock signal $V_{C2}$ is also high. When the clock $V_{C2}$ is low, only the transistor $Q_{12}$ is ON, currents flow through the resistor $R_4$ and the output $Z_2$ is low, as the clock signal $V_{C2}$ is low. Therefore, the output $Z_2$ always has the same waveforms as that of the clock $V_{C2}$. In accordance with the content of data input $V_{D2}$ and with an immediately previous state, it may happen that the current flowing through the transistors $Q_8$ or $Q_{10}$ is shunted into the transistors $Q_8$ or $Q_{10}$. In such a case, however, because of the common connection of the collectors of those transistors, the flowing currents are always constant due to the use of a constant current source I2. The signal levels at the outputs $Z_2$ and $\overline{Z_2}$ are not affected. Thus, with this arrangement, by switching the control input $V_M$, an optional one of the outputs of a latch circuit is obtained due to the data of $V_{D2}$ and clock of $V_{C2}$. The output has a waveform of the clock $V_{C2}$ as it is obtained at the output $Z_2$. Further, since the circuit current is determined by only the constant current source I2, a power consumed by the embodiment is increased a little, as compared to the circuit shown in FIG. 1. With respect to a delay time of the circuit, since the collector capacitances of the transistors $Q_7$ and $Q_{12}$ are merely added to the outputs $Z_2$ and $\overline{Z_2}$, the addition of the capacitances hardly effects the gate delay time.

As seen from the foregoing description, the flip-flop circuit according to the invention is constructed by merely adding a slight number of components and a control terminal to the conventional current switching type latch circuit. With such a simple construction, by controlling the control terminal, the proper output of the conventional latch circuit or a waveform which is the same as the waveform of the clock input may be optionally obtained, with no increase of either power consumption or delay time. Therefore, the flip-flop circuit according to the invention is advantageously applied to construct an integrated logic circuit including a sequential circuit.

One of the applications of the flip-flop circuit according to the invention is a frequency divider operating at high frequencies. In order to divide a high frequency, it is usual that toggle flip-flops or D-flip-flops are constructed by applying proper feedbacks to a master flip-flop and a slave flip-flop, which use the latch circuits shown in FIG. 1. Those circuits are combined to produce outputs of a predetermined frequency dividing ratio. In this case, if the circuit of the invention is used as a latch circuit of the slave in a specific flip-flop, various and variable frequency dividing ratios may be readily obtained.

A frequency divider is realized by the flip-flop circuits according to the invention and will be described with reference to FIG. 3 through FIG. 6. A frequency dividing circuit shown in FIG. 3 receives a clock pulse CP to divide the clock pulse CP by frequency dividing ratios of 1/10 to 1/44. Toggle flip-flops TF1 and TF2 use flip-flops according to the invention, each with a frequency dividing ratio of $\frac{1}{2}$. By controlling signal levels at terminals $M_1$ and $M_2$, input signals applied to clock input terminals C and $\overline{C}$ may be output to the outputs Q and $\overline{Q}$, as they are. In this case, the frequency dividing ratios of the flip-flops TF1 and TF2 are respectively 1. Therefore, an output of the clock pulse CP frequency-divided by one of the three frequency-dividing ratios 1, $\frac{1}{2}$ and $\frac{1}{4}$ is obtained on the output lines $Q_2$ and $\overline{Q_2}$. The output lines $Q_2$ and $\overline{Q_2}$ are coupled with a variable counter section 20 comprising delay (D) flip-flops DF1 to DF4 connected in a cascade fashion. Either the frequency-divider ratio 1/10 or 1/11 is selectable by controlling a signal level at the terminal $M_3$. Therefore, the frequency divider shown in FIG. 3 has six frequency dividing ratios, as shown in Table 1, when signal levels at the terminals $M_1$, $M_2$ and $M_3$ are properly set.

TABLE 1

| No. | Frequency Dividing Ratios | $M_1$ | $M_2$ | $M_3$ |
|---|---|---|---|---|
| 1. | 1/10 | 1 | 1 | 1 |
| 2. | 1/11 | 1 | 1 | 0 |
| 3. | 1/20 | 1 | 0 | 1 |
| 4. | 1/22 | 1 | 0 | 0 |
| 5. | 1/20 | 0 | 1 | 1 |
| 6. | 1/40 | 0 | 0 | 1 |
| 7. | 1/44 | 0 | 0 | 0 |
| 8. | 1/22 | 0 | 1 | 0 |

In Table 1, the combinations of Nos. 3 and 5, and 4 and 8 provide same frequency dividing ratios, respectively. In the circuit shown in FIG. 3, a terminal INZ is connected to terminals Z of the respective flip-flops and is used to set the respective flip-flops to between initial states, before the circuit starts to count.

Figure 3:
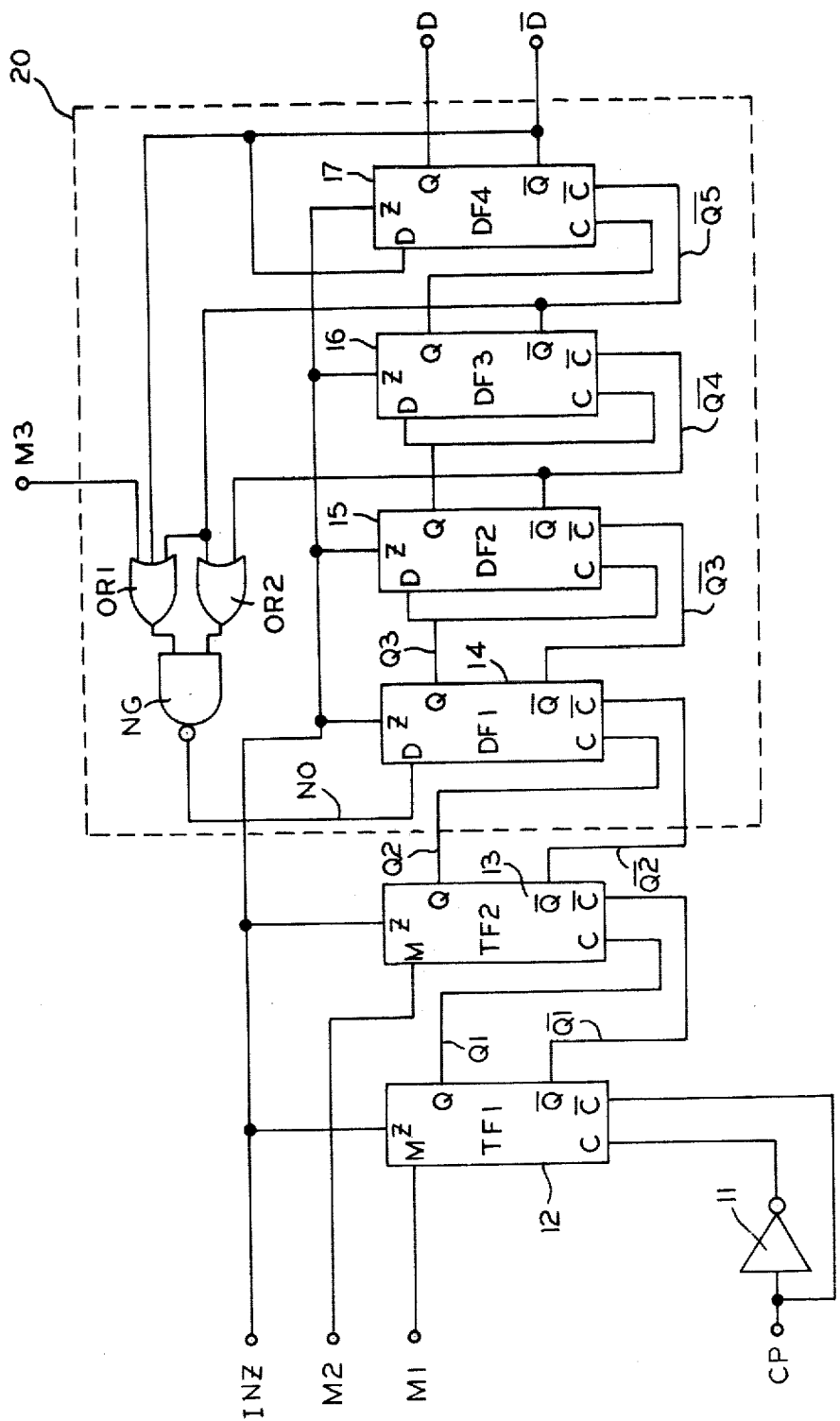
FIG. 3 shows a block diagram of a frequency dividing circuit to which the present invention is applied.
Figure 4:
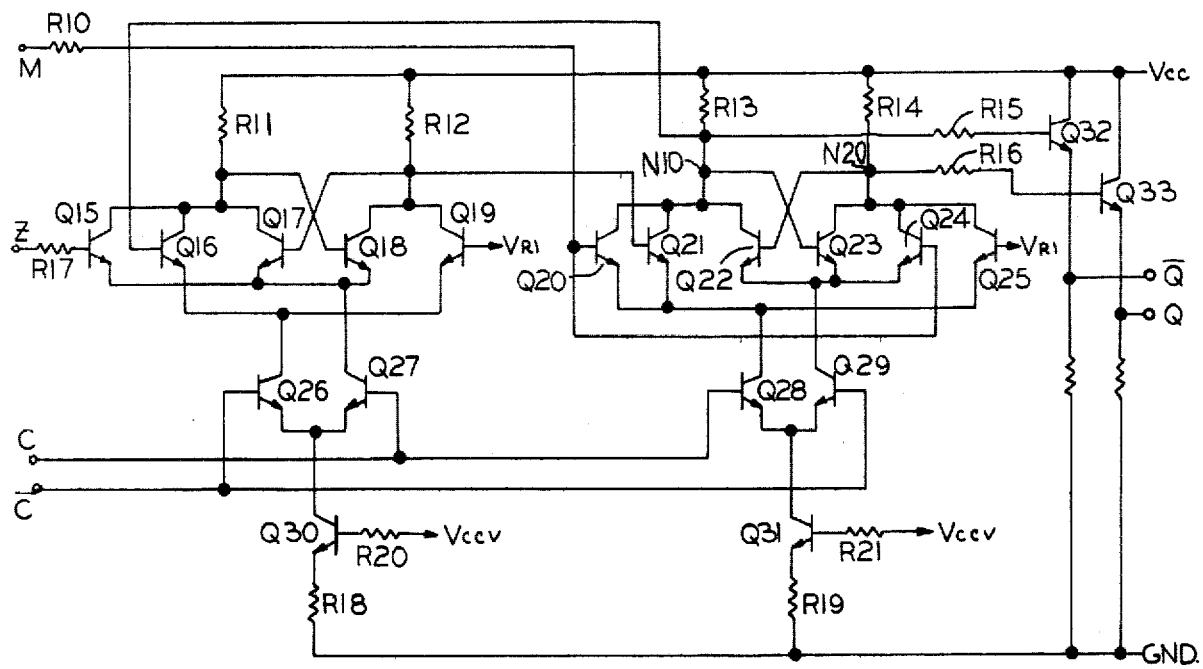
FIG. 4 shows a circuit diagram of a flip-flop circuit of a second embodiment according to the invention.

FIG. 4 shows a circuit construction of the toggle flip-flops TF1 and TF2 employing flip-flops according to the invention in FIG. 3. As shown, transistors $Q_{15}$ to $Q_{19}$, $Q_{26}$, $Q_{27}$ and $Q_{30}$ cooperatively form a master flip-flop and a complementary phase of output at a node $N_{10}$ of a slave flip-flop. According to the invention, the slave flip-flop includes transistors $Q_{20}$ of $Q_{25}$, $Q_{28}$, $Q_{29}$, and $Q_{31}$. The complementary phase is fed back to the base of the logic input transistor $Q_{16}$. The transistors $Q_{30}$ and $Q_{31}$ are biased by a bias voltage $V_{CCV}$ and operate as constant current sources.

In the slave flip-flop, the bases of transistors $Q_{20}$ and $Q_{24}$ are connected to the terminal M in accordance with the invention. The transistors $Q_{20}$ and $Q_{24}$ are both nonconductive when the terminal M is in a low (logic "0") level, so that the flip-flop is in a normal operating condition. When the terminal M is in a high (logic"1") level, both of the transistors $Q_{20}$ and $Q_{24}$ produce output signals at output points $N_{10}$ and $N_{20}$ which correspond to true and complementary signals applied to terminals C and $\overline{C}$. The output levels at the output points $N_{10}$ and $N_{20}$ are applied to the output terminals Q and $\overline{Q}$, through emitter-follower transistors $Q_{32}$ and $Q_{33}$, respectively. Incidentally, a reference voltage may be applied to the bases of the transistors $Q_{27}$ and $Q_{29}$ without applying the complementary signal thereto.

Figure 5:
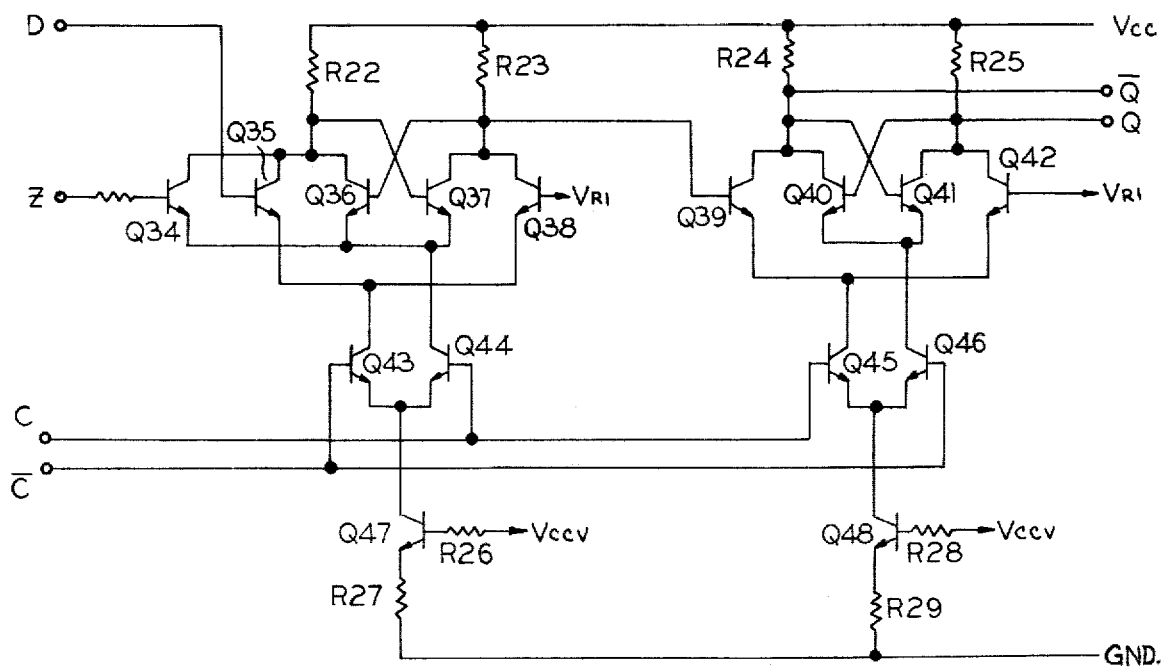
FIG. 5 shows a circuit diagram of a delay type flip-flop shown in FIG. 3.

Turning now to FIG. 5, there is shown a circuit diagram of the delay flip-flops DF1 to DF4 in the counter 20 shown in FIG. 3. In FIG. 5, transistors $Q_{34}$ to $Q_{38}$, $Q_{43}$, $Q_{44}$ and $Q_{47}$ cooperatively form a master flip-flop. Transistors $Q_{39}$ to $Q_{42}$, $Q_{45}$, $Q_{46}$ and $Q_{48}$ similarly form a slave flip-flop. The input terminal D of the delay flip-flops is connected to the base of the transistors $Q_{35}$. True and complementary control signals are supplied to the terminals C and $\overline{C}$. The transistors $Q_{47}$ and $Q_{48}$ are biased by the voltage $V_{CCV}$ and constitute constant current sources. Incidentally, in the delay flip-flop DF4, the output $\overline{Q}$ is fed back to the input terminal D. As mentioned above, a reference voltage may be applied to the bases of the transistors $Q_{44}$ and $Q_{46}$ without the provision of the terminal $\overline{C}$.

Figure 6:
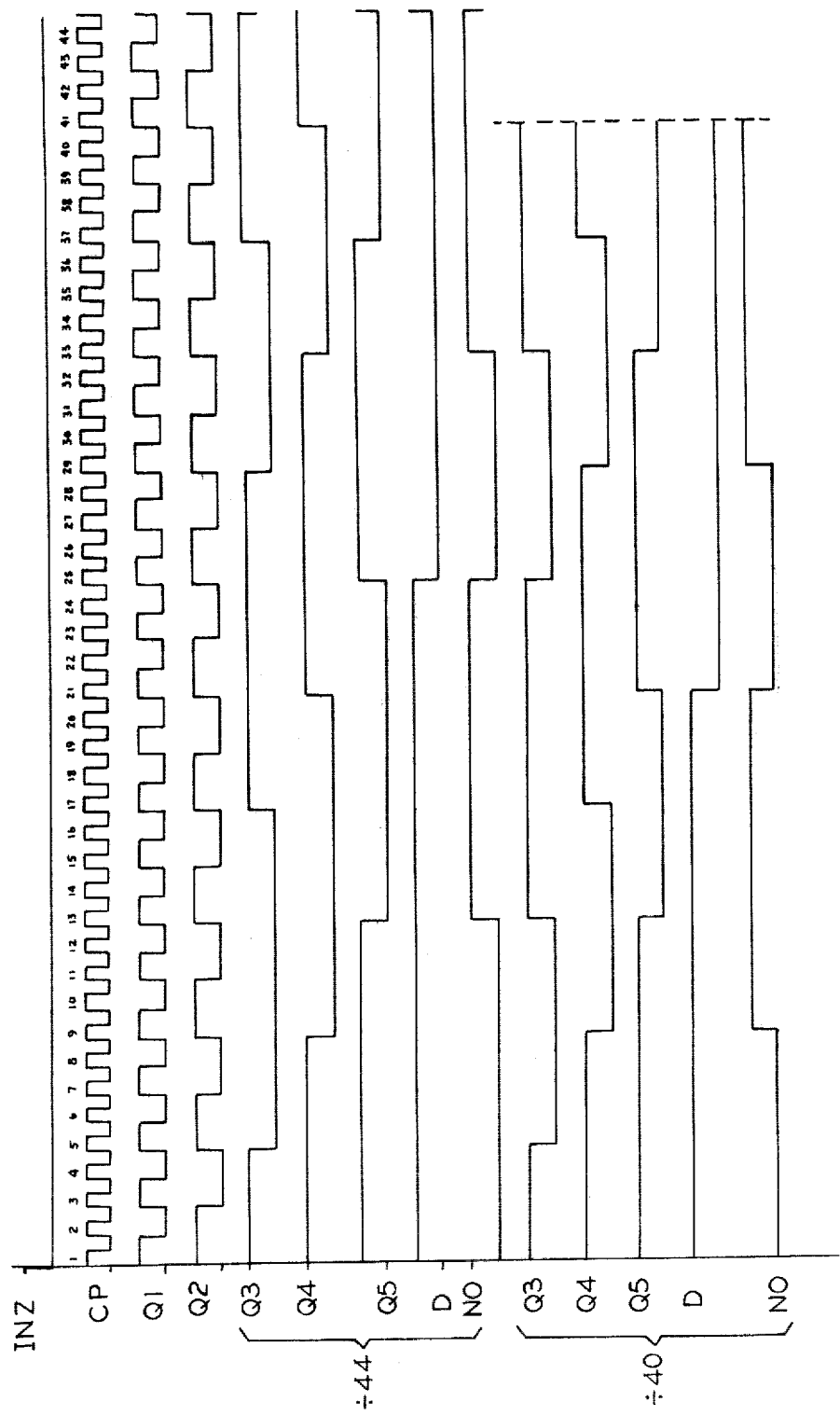
FIG. 6 shows a set of timing diagrams which are useful in explaining the operation of the frequency divider shown in FIG. 3.

The operation of the circuit shown in FIG. 3 will be described with reference to FIG. 6. For simplicity, it is assumed that a rectangular waveform of the clock pulse CP is applied to the circuit and waveforms at the respective portions of the circuit shown in FIG. 3 are designated by corresponding reference symbols. Those flip-flops $TF_1$ and $TF_2$, and DF1 to DF4 are all arranged in a master-slave fashion in which the master flip-flop is in a gate condition at the trailing edge of the input pulse CP (clock pulse) which is to be divided. The slave flip-flop is in a gate condition at the leading edge of the input pulse, so that the output thereof changes. Under such a condition, the input pulse (clock pulse CP) is kept at a high level and the master flip-flop is held. The slave flip-flop is in the gate condition. If the terminal INZ is in a high level, the flip-flops are all set to high level, so that these flip-flops are forcibly set to the initial state. Although the waveforms in FIG. 6 are shown in the case of the frequency ratios 44 ($\div 44$) and 40 ($\div 40$) where terminals $<M_1$, $M_2$ and $M_3>$ are respectively kept logic ("0", "0", and "0") and ("0", "0", and "1"), the same thing is true for other cases, if the outputs of the toggle flip-flops TF1 and TF2 are considered to be the input pulses.

The above-mentioned embodiments use NPN type transistors, of a type which is now predominantly used in the integrated circuit. It is evident that PNP type transistors or insulated-gate field effect transistors may also be used similarly in the invention.

I claim:

1. A flip-flop circuit comprising a first node, a second node, a first common node, a second common node, a first transistor having a collector coupled to said first node, a base coupled to said second node, and an emitter coupled to said first common node, a second transistor having a collector coupled to said second node, a base coupled to said first node and an emitter coupled to said first common node, a third transistor having a collector coupled to said first node and an emitter coupled to said second common node, a fourth transistor having a collector coupled to said second node and an emitter coupled to said second common node, a constant current source means, means responsive to a signal for selectively coupling one of said first common node and said second common node to said constant current source means, a control terminal, a fifth transistor having a collector coupled to said first node, a base coupled to said control terminal and an emitter coupled to said second common node, and a sixth transistor having a collector coupled to said second node, a base coupled to said control terminal and an emitter coupled to said first common node.

2. A flip-flop circuit comprising a first and a second nodes, a first transistor having a collector coupled to said first node, a base coupled to said second node and an emitter, a second transistor having a collector coupled to said second node, a base coupled to said first node and an emitter, a third and a fourth transistors having collectors respectively coupled to said first and the second nodes first means for operatively supplying both the emitters of said first and second transistors with a constant current, second means for operatively supplying emitters of both said third and fourth transistors with a constant current, third means responsive to a control signal for enabling one of said first and second means, first switching means coupled in parallel with the collector and the emitter of said first transistor, and second switching means coupled in parallel with the collector and the emitter of said fourth transistor, wherein said first and the second switching means are controlled by the same signal.

3. A circuit comprising a first node, a second node, a third node, a fourth node, a first transistor having a first part coupled to said first node, a control part coupled to said second node and a second part coupled to said third node, a second transistor having a first part coupled to said second node, a control part coupled to said first node and a second part coupled to said third node, a third transistor having a first part coupled to said first node and a second part coupled to said fourth node, a fourth transistor having a first part coupled to said second node and a second part coupled to said fourth node, at least one of said third and fourth transistors receiving a first signal at its control part, a constant current source means, means responsive to a second signal for selectively coupling one of said third node and said fourth node to said constant current source means, a first switching means coupled between said second node and said third node and a second switching means coupled between said first node and said fourth node, said first and second switching means being simultaneously controlled by a control signal.

4. The circuit according to claim 4, in which said first to fourth transistors are bipolar transistors having collectors as their first parts, bases as their control parts and emitters as their second parts.

5. In a circuit comprising first to Nth (N is an integer of 2 or more) stages of master-slave flip-flops coupled in a cascade manner, each of said master-slave flip-flops including a master flip-flop and a slave flip-flop, said master flip-flop including a first and a second node, a first transistor having a collector coupled to said first node and a base coupled to said second node, a second transistor having a collector coupled to said second node and a base coupled to said first node, a third transistor having a collector coupled to said first node, a fourth transistor coupled to said second node, and first means responsive to a first control signal for selectively enabling one pair of said first and second transistors and third and fourth transistors, said slave flip-flop including a third and a fourth nodes, a fifth and sixth transistors having collectors and bases cross-coupled at said third and fourth nodes, a seventh and an eighth transistors having collectors respectively coupled to said third and fourth nodes, and second means responsive to a second control signal having a complementary relation to said first control signal for selectively enabling one pair of said fifth and sixth transistors and said seventh and eighth transistors, said second nodes being coupled to a base of said seventh transistor, the improvement comprising in at least one of said slave flip-flops first switching means selectively coupling said fourth node and an emitter of said sixth transistor, second switching means selectively coupling said third node and an emitter of said seventh transistor and means for simultaneously making said first and second switch means conducting.

6. The circuit according to the claim 5, wherein said first stage of said master-slave flip-flop further includes means for transferring a level of said third node to a base of said third transistor.

7. A circuit comprising a latch circuit means having a pair of output terminals and an enable node, a first current switching circuit means with a pair of output terminals commonly used with said pair of output terminals of said latch circuit means and with an enable node, a second current switching circuit means having a first output node and a second output node, means for connecting said first output node to said enable node of said latch circuit means, means for connecting said second output node to said enable node of said first current switching circuit means, first switching means connected between one of said pair of output terminals and said first output node, second switching means connected between the other of said pair of output terminals and said second output node, and means for supplying said second current switching circuit means with a first signal and means for simultaneously supplying said first and second switching means with a second signal.

* * * * *